(12) United States Patent
Conlon et al.

(10) Patent No.: US 6,781,093 B2
(45) Date of Patent: Aug. 24, 2004

(54) CIRCUIT SINGULATION SYSTEM AND METHOD

(75) Inventors: Peter Conlon, Dublin (IE); James Mahon, Dublin (IE); Adrian Boyle, County Kildare (IE); Mark Owen, Beaverton, OR (US)

(73) Assignee: Xsil Technology Limited, Dublin (IE)

( * ) Notice: Subject to any disclaimer, the term of this patent is extended or adjusted under 35 U.S.C. 154(b) by 308 days.

(21) Appl. No.: 10/060,414

(22) Filed: Feb. 1, 2002

(65) Prior Publication Data

US 2004/0020901 A1 Feb. 5, 2004

Related U.S. Application Data

(63) Continuation of application No. PCT/IE00/00095, filed on Aug. 3, 2000.

(30) Foreign Application Priority Data

Aug. 3, 1999 (IE) ................................................. 990664

(51) Int. Cl.[7] .......................... B23K 26/36; B23K 26/38
(52) U.S. Cl. ................................................. 219/121.72
(58) Field of Search ........................ 219/121.6, 121.67, 219/121.68, 121.69, 121.7, 121.71, 121.72, 121.85

(56) References Cited

U.S. PATENT DOCUMENTS

| | | | |
|---|---|---|---|
| 5,500,505 A | 3/1996 | Jones | 219/121 |
| 5,593,606 A | 1/1997 | Owen et al. | 219/121 |
| 5,928,526 A | 7/1999 | Morley | 216/65 |
| 6,472,295 B1 * | 10/2002 | Morris et al. | 438/463 |

FOREIGN PATENT DOCUMENTS

| | | |
|---|---|---|
| DE | 19807956 A1 | 8/1998 |
| EP | 0884128 A1 | 12/1998 |
| JP | 04066287 | 3/1992 |
| JP | 04150090 | 5/1992 |
| JP | 04333299 | 11/1992 |
| WO | WO98/52212 | 11/1998 |
| WO | WO99/03128 | 1/1999 |

OTHER PUBLICATIONS

R. Srinavasan et al, Applied Physics Letters, vol. 41(6), 1982 p. 576, Self–developing photoetching of poly(ethylene . . . .
Handbook of Chemistry and Physics, Ed. 1978–1979, CRC Press, p. F239, Table 3.
P.E. Dyer et al, Journal of Applied Physics, vol. 57(4), 1985 pp. 1420–1422, Excimer laser ablation and thermal coupling . . . .
J.H. Brannon et al, Journal of Applied Physics, vol. 58(5), 1985, pp. 2036–2043, Excimer laser etching of polyimide.
R. Srinivasan et al, Applied Physics, vol. 61(1), 1987, pp. 372–376, Ultraviolet laser ablation of polyimide films.
R.C. Estler et al, Applied Physics Letters, vol. 49(18), 1986 pp. 1175–1177, Mass spectroscopic identification of . . . .

(List continued on next page.)

Primary Examiner—Samuel M. Heinrich
(74) Attorney, Agent, or Firm—Timothy J. Keefer; Seyfarth Shaw LLP

(57) ABSTRACT

Electronic circuits such as IC packages, circuit boards, of flex circuits are singulated by laser cutting of adjoining laminated material. The laser beam has a wavelength of less than 400 nm, and either a minimum energy density of 100 J/cm2 or a minimum power density of 1GW/cm2. The method avoids the need for cleaning and intermediate handling, and there is a greatly improved throughput.

25 Claims, 10 Drawing Sheets

OTHER PUBLICATIONS

G. Koren et al, Applied Physics Letters, vol. 44(12), 1986 pp. 1112–1114, Emission spectra, surface quality, and . . . .

G.S. Hansen et al, Journal of Applied Physics, vol. 68(4), 1990 pp. 1878–1882, Wavelength effects in the ultraviolet–laser . . . .

D.L. Singleton et al, Chemical Physics, vol. 144, 1990, pp. 415–423, Comparison of Theoretical Models of Laser Ablation . . . .

R. Srinivasan et al, Applied Physics Letters, vol. 53(14), 1988 pp. 1233–1235, Influence of pulse width on ultraviolet . . . .

R. Srinivasan et al, Journal of Applied Physics, vol. 68(4), 1990, pp. 1842–1845, Nature of incubation pulses in the . . . .

* cited by examiner

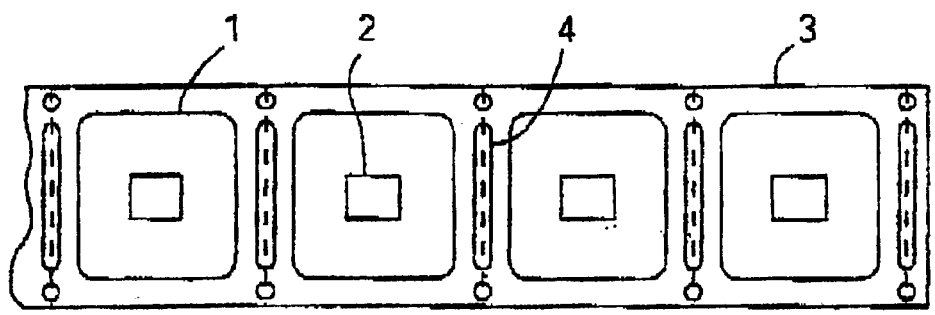
Fig. A(a)
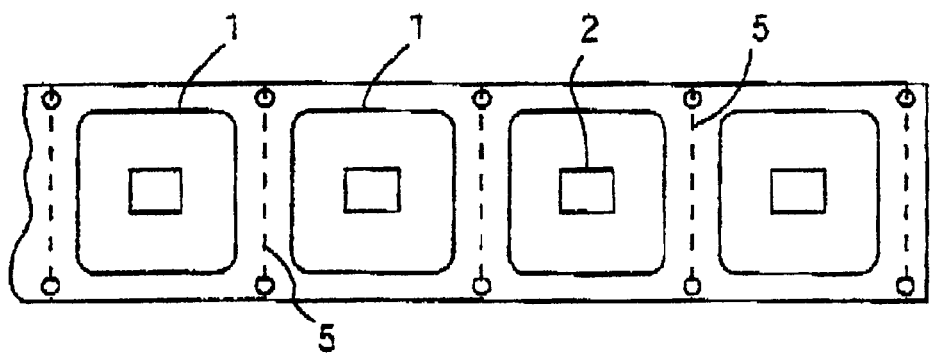
Fig. A(b)
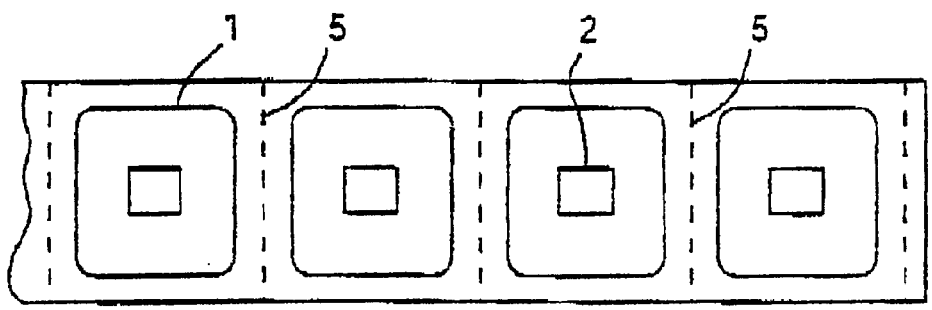
Fig. A(c)
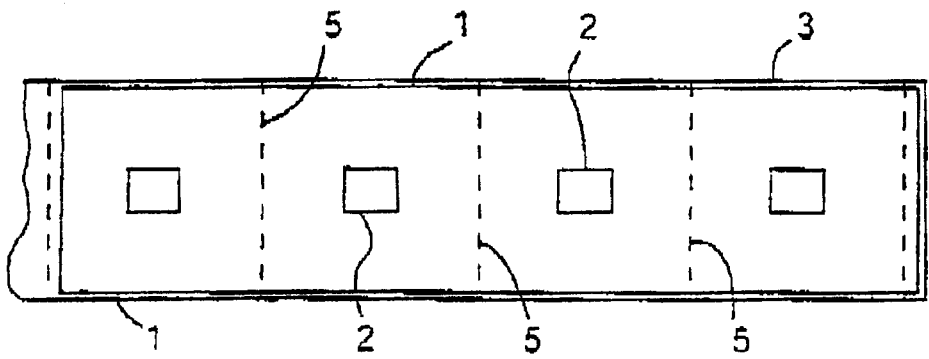
Fig. A(d)
Fig. A

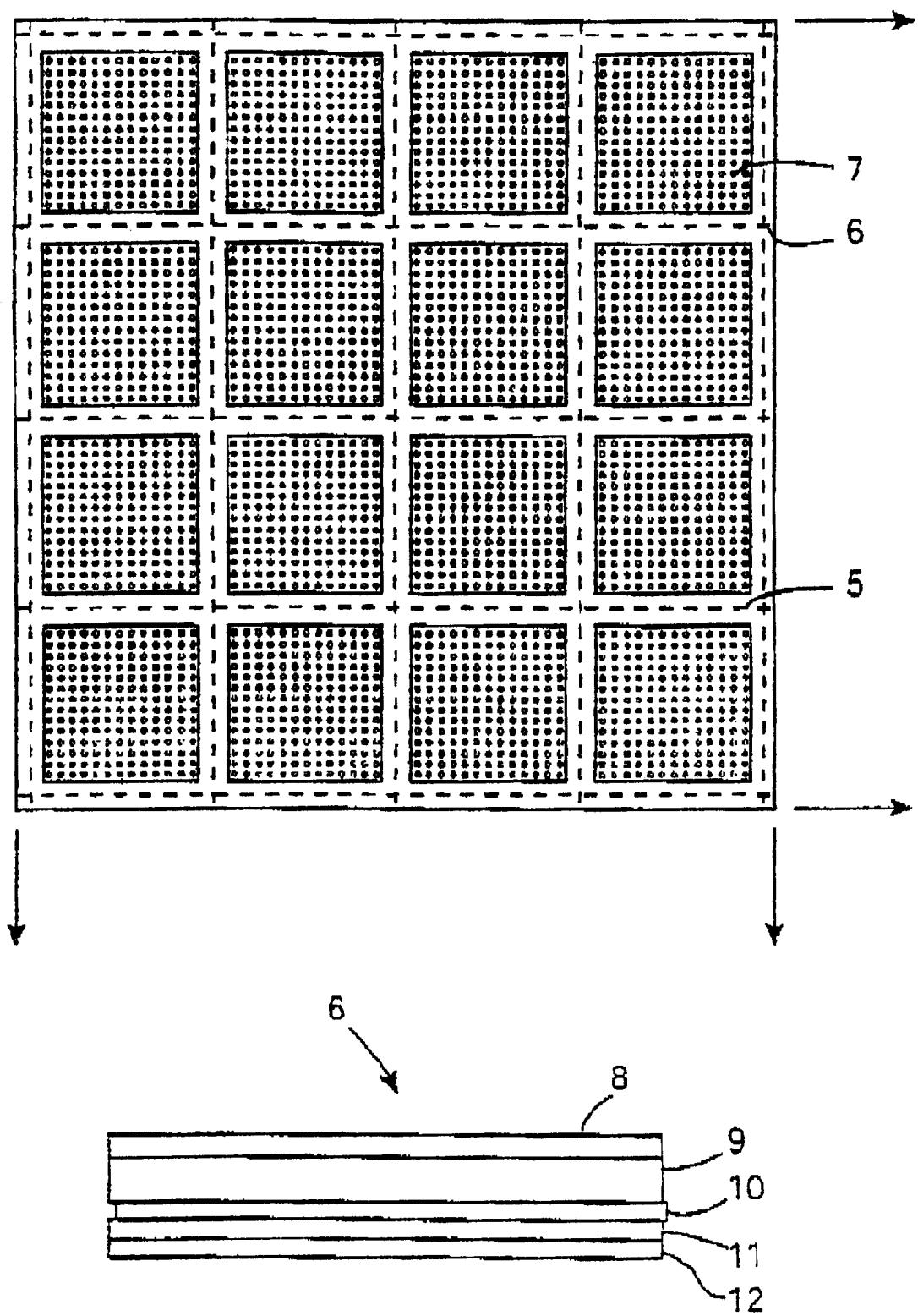
Fig. B

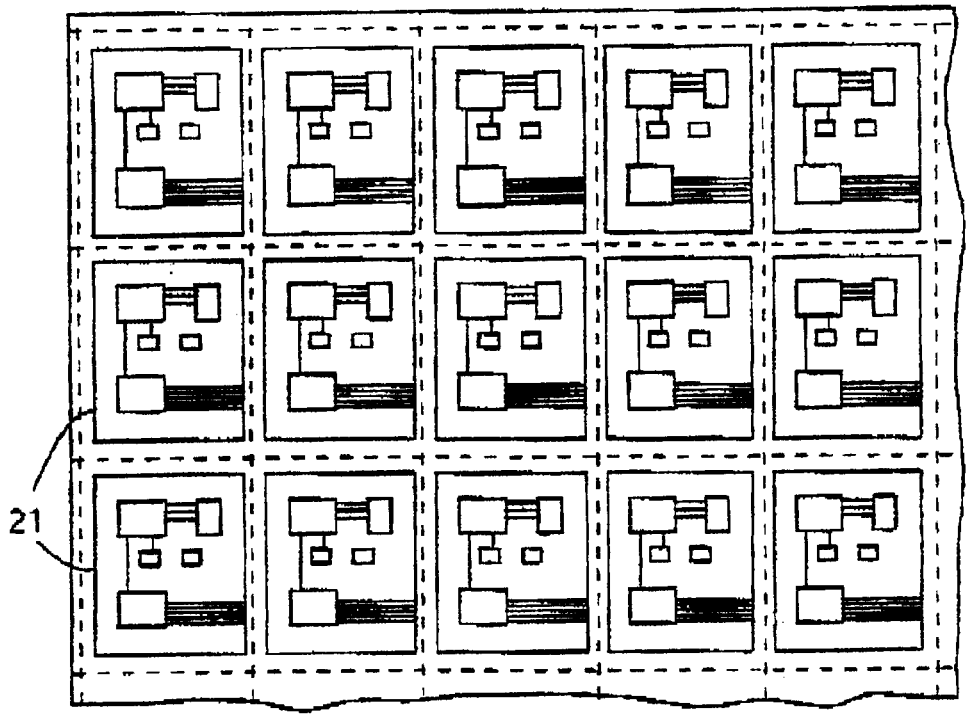
Fig. C
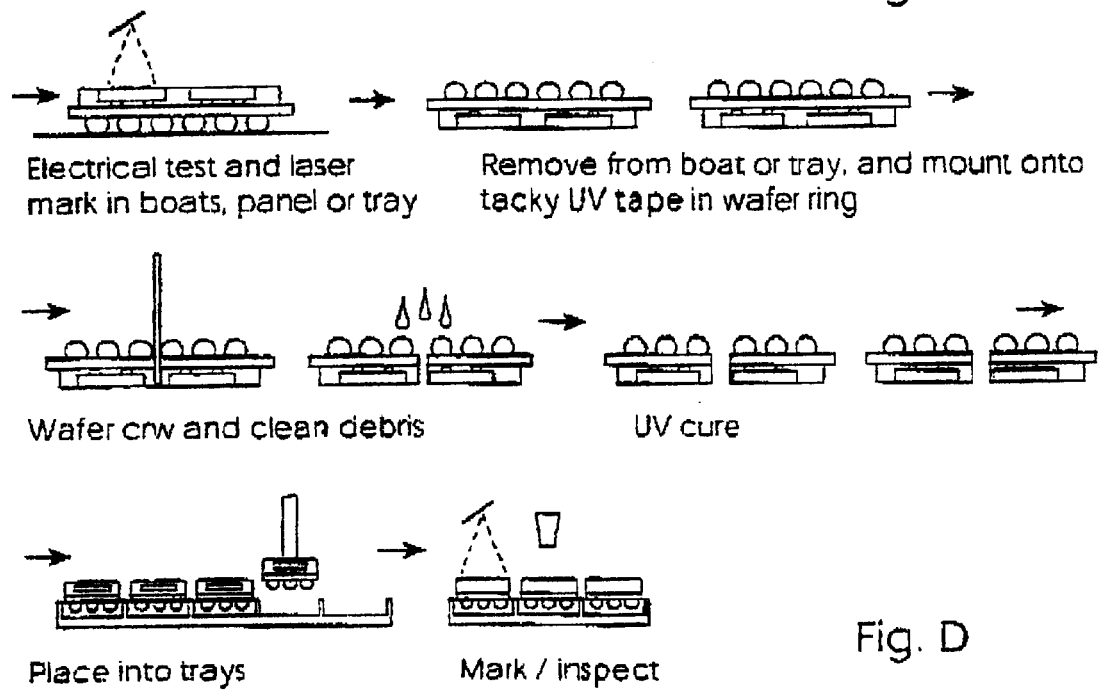
Electrical test and laser mark in boats, panel or tray
Remove from boat or tray, and mount onto tacky UV tape in wafer ring
Wafer cnv and clean debris
UV cure
Place into trays
Mark / inspect
Fig. D

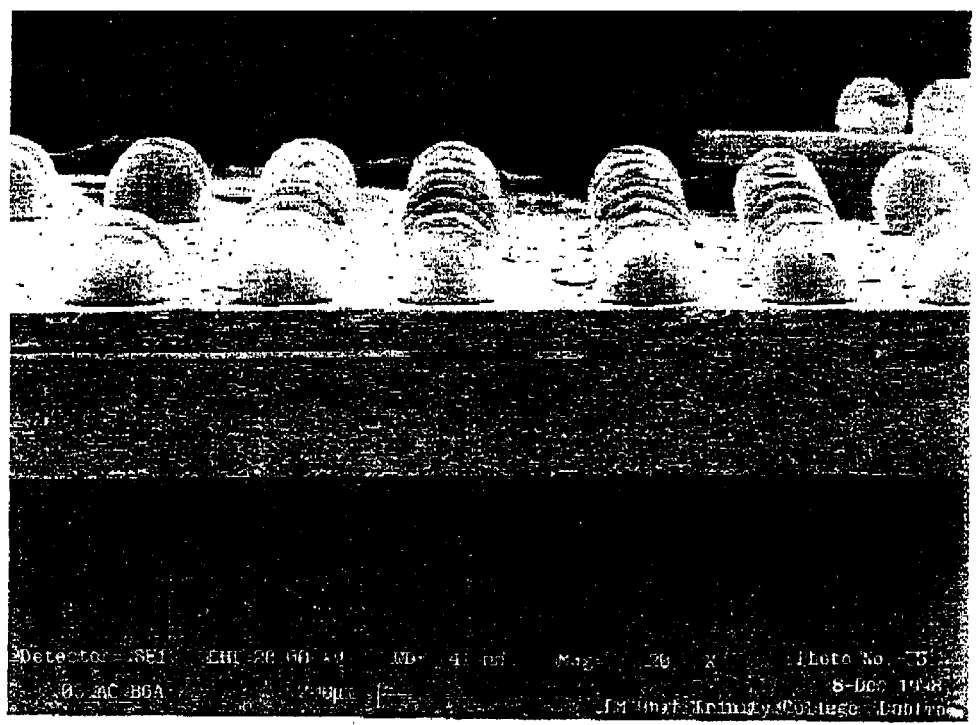
Figure 6: 20X magnification SEM (no coating) illustrating clean edge quality achievable using multiple passes at high speed.

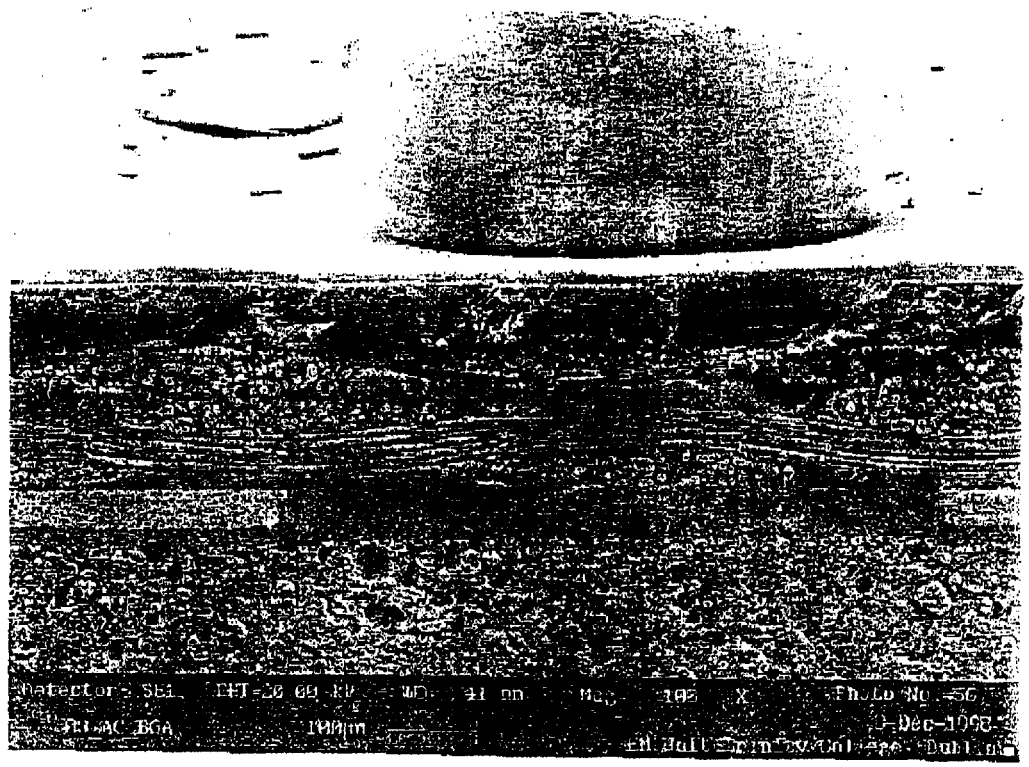
Figure 7: 100x magnification as in figure 6. The various layers are from the top, solder mask, glass fibre/epoxy, copper and encapsulant.

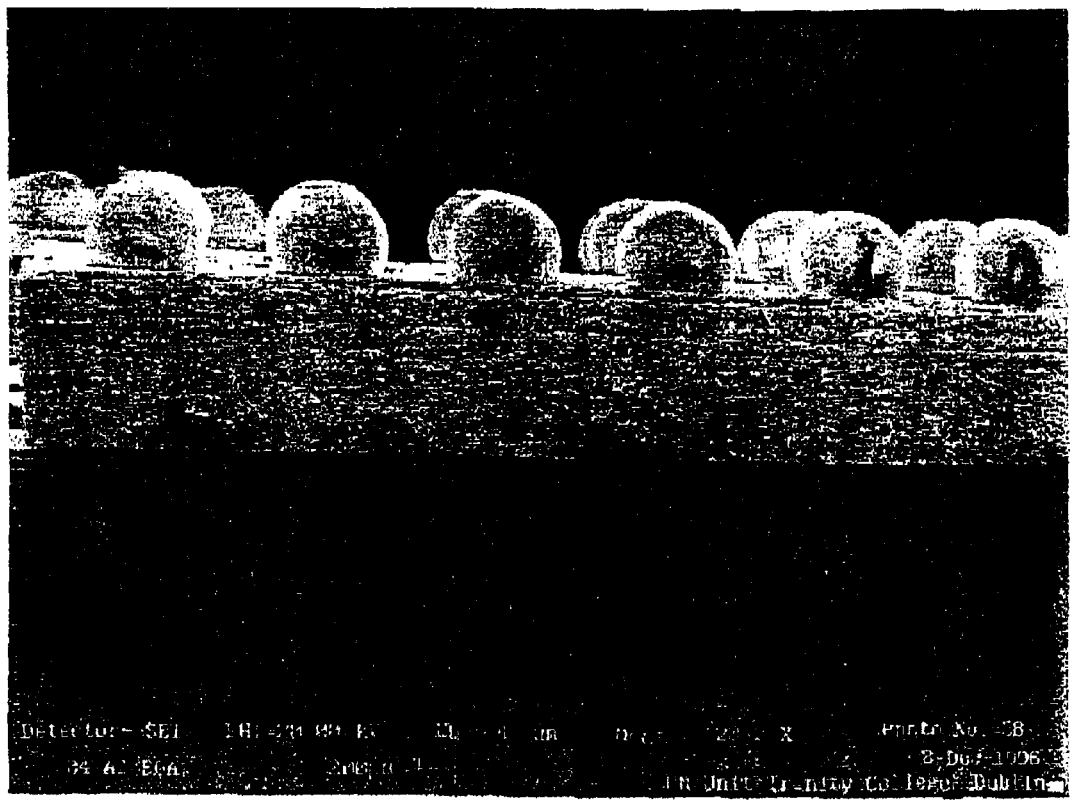
Figure 8: If the number of scans and scan velocity are reduced the edge quality deteriorates signifiantly.

Figure 9: 100X magnification of fig 8. Delamination of the solder mask, melting of glass fiber and re-deposition of debris occurs if the machining process is not optimized.

CIRCUIT SINGULATION SYSTEM AND METHOD

This is a continuation application of PCT/IE00/00095, filed August 3, 2000, and published in English.

INTRODUCTION

The invention relates to a method and machine to cut circuit boards or integrated circuit packages.

FIELD OF THE INVENTION

In recent years, in the microelectronics industry there has been a drive for lightweight low profile consumer electronics products such as laptop computers and mobile telephones. These consumer electronics products require high-throughput assembly of low-cost, low-profile and lightweight integrated circuit packages. Integrated circuits are packaged in multiple units to achieve the required throughput and to reduce handling requirements. At the end of this process it is then necessary to singulate the packaged devices.

By reducing the area of the integrated circuit package it is also possible to reduce the area of the circuit boards on which these devices will perform their function. To this end, circuit boards are becoming lighter and smaller.

The materials from which integrated circuit packages or circuit boards are fabricated may include, for example, copper layers, gills fiber layers or weave, FR4, BT glass/epoxy, adhesives, encapsulants, solder masks or semiconductor. Another type of circuit board, is a polymer-based flexible (flex) circuit. Also, the invention may be applied to cut thin layers such as liquid crystal sheets or electrochromic dielectric thin films as used in displays.

FIGS. A(a) to A(d) show examples of strips on which several BGA devices are mounted. In FIG. A(a) encapsulant material 1 protects the die 2 and the electrical connections between the die and the substrate 3. The assembly process may require the presence of tooling holes and cut out sections 4 for ease of punching. The strip of FIG. A(a) is similar to that of FIG. A(a) except that cut out strips are missing, and in the strip of FIG. A(c) there are no tooling holes. In the strip of FIG A(d) the encapsulant covers multiple dies. In this situation, BGA singulation requires that the encapsulant be cut also. The dashed lines 5 in the drawings indicate the cutting lines to singulate individual packages.

A further example of a multiple unit, chip-scale package assembly is shown in FIG. B. In this example dies are mounted on a substrate in two dimensions to form an N×N assembly of BGA packages 6. FIG. B shows the underside of the assembly. Solder balls 7 are positioned at the correct position on the circuit board and are then reflowed. The reflowed solder balls then form the electrical contact between the circuit board and the package. The electrical connection to the die is through the package substrate. The substrate layers may be copper layers, glass fiber layers or weave, FR4, BT glass/epoxy, adhesives, encapsulants, solder masks or semiconductor. Referring to the end view in FIG. B the substrate often comprises multiple layers which may include solder mask 8, copper 9, dielectric 10, glass 11, and epoxy 12. Gold or another conductor may be used in the layer 9 instead of copper.

FIG. C shows an ample of a circuit board panel containing multiple circuit boards 21. Such panels may be those used for "smart cards" or mobile telephone circuits. The circuit board material may be rigid or flexible material made from laminated layers of copper layers, glass fiber layers or weave, FR4, BT glass/epoxy, adhesives, encapsulants, solder masks, or other materials used in circuit board manufacture.

The circuit board may be of a flexible material. This type of circuit generally is made from layers of copper, adhesive and polymer such ad Kapton polyimide or another polymer with the required mechanical properties.

The electronics industry also uses liquid crystal, electrochromic or more generally, thin film sheeting in liquid crystal displays or in mass-produced display assemblies.

Regarding the preset methods of singulation, FIG. D shows the final steps involved in the present method of manufacturing of BGA/CSP devices. Due to the nature of the devices and systems involved, several handing and cleaning steps must be added in order to support the singulation process with wafer saws. The steps include:

electrical test and laser mark in boats, panels or trays,
removal from boat or tray and mounting on tacky UV tape,
cutting with saw and cleaning,
UV cure,
placing on trays,
marketing and inspection.

Sawing and punching of chip scale packages is described in WO9903128: (Singulation system for chip scale packages) and in WO98/52212: (Pick and place cutting head that separates chip scale packages from a Multi layered film strip). Several consumables, such as UV tape, wafer rings, saw blades, and cleaning solutions must be used.

An object of the invention is to provide a system and a method to cut through the above materials at a rate sufficient to meet the singulation rate requirements for a production line.

Another object is that the method and apparatus provide a higher yield by reducing the extent of deposited debris and by reducing handling requirements.

SUMMARY OF THE INVENTION

According to the invention, there is provided a method for singulating an electronic circuit by cutting laminated material joining the circuits, the method comprising the step of:

generating a laser beam having the following properties:
a wavelength of less than 400 nm, and
a minimum energy density of 100 J/cm$^2$ or a minimum peak power density of 1GW/cm$^2$;
aligning the beam relative to a feature or fiducial of the material; and
training the beam along the material until a cut has been made.

In one embodiment, beam is moved to have a spatial overlap of consecutive pulses, the overlap being in the range of 5% to 95%.

In one embodiment, the overlap is in the range of 30% to 50%.

In another embodiment, the beam is moved in a plurality of passes.

In a further embodiment, the beam is moved in greater than five passes.

In one embodiment, the beam is generated with a pulse repetition rate of greater than 1 kHz.

In one embodiment, the thickness of the laminated structures may be up to the thickness defined by the depth of focus of the laser beam.

In one embodiment, the laminate material contains two or more layers selected from BT epoxy, glass fibers, copper, gold, poly-imide, adhesive, overmold materials, underfills, conductors, dielectrics, stiffeners, stabilisers, protectors or other materials as used in electronic packaging.

In another embodiment, the individual layers of the laminate material have different ablation and ionization thresholds, different abalation and ionization rates, and different non-linear absorption and non-ionization coefficients.

In a further embodiment, the beam is generated from a solid state laser with a characteristic average power peak at a specific repetition frequency.

In one embodiment, the beam is controlled so that the average power drops as the repetition frequency is increased or decreased, and although individual pulse energy may be increased at a repetition frequency other than the repetition frequency for maximum average power the maximum cut rate is achieved at a repetition frequency other than either of these frequencies due to the contribution of other laser cutting parameters.

In one embodiment, the average power of said laser beam is greater than 3W, with a pulse width less than 100 nanoseconds, a consecutive pulse spatial overlap of 10–70%, and a beam diameter less than 70 microns at the $1/e^2$ point of a spatial intensity profile.

In one embodiment, the laser beam is generated by a diode laser pumped gain medium device with a fundamental emission in the 900 to 1600 nm wavelength range and with second, third, fourth or fifth harmonic generation of ½, ⅓, ¼, $⅕^{th}$ of this wavelength which is obtained by placing appropriate crystals in the laser cavity or outside the laser cavity.

In one embodiment, said laser device may be of the Nd: YAG, ND: YLF, Nd: YVO4 or the other combinations of Impurity:Host gain media lasting in the required range and with harmonic generation to an operating wavelength of less than 400 nm.

In one embodiment, the beam is delivered to the work surface using one or more mirrors mounted on one or more scanning galvanometers, and in which the required spot size is achieved by use of an on-axis lens position adjustment at a stage before the galvanometer mirror, and at a stage after the galvanometer mirror by a lens of a flat field lens, or by the use of a combination of these lenses.

In one embodiment, the laser beam is delivered using one or more mirrors mounted on one or more translational stages, and focusing is achieved by the use of a telescope or an on-axis lens before the moving mirrors or lens mounted before the sample surface and moving with the beam delivery mirror such that the focussed beam is delivered to the sample surface.

In another embodiment, the beam is telescoped and focussed to achieve the required spot size at the cutting plane with the telescope or scan lens chosen such that the beam waist remains within a specified percentage of the optimum spot size throughout the range over which the beam is delivered, and where the range is greater than the thickness of the part.

In a further embodiment, an assist gas is used to assist the cutting process to prevent debris from being deposited on the material surface, and wherein the assist gas removes material generated during the cut process so that it does not create absorption or scattering of consecutive laser light pulses.

In a still further embodiment, the assist gas is used to provide an inert atmosphere to prevent unwanted specific photochemical or photo-physical reactions form occurring during cutting.

In one embodiment, a vacuum suction process is used to extract fumes and solid debris generated at the cut surface.

In one embodiment, alignment of the laser beam to a feature on the material surface is achieved by use of a sensor and means for image processing to provide the coordinates along which cutting occurs, and wherein a beam positioning mechanism is controlled to ensure that the laser beam follows the required cutting path.

According to another aspect the invention provides a circuit singulation system comprising:

means for supporting a set of electronic circuits interconnected by material;

a laser beam source comprising means for generating a laser beam having:
a wavelength of less than 400 nm, and
a minimum energy density of $100J/cm^2$ or a peak power density of $1GW/cm^2$, a beam positioning mechanism comprising means for directing the beam a the material and for training it along cut lines to singulate electronic circuits.

In one embodiment, the beam positioning system comprises a series of mirrors, at least some of which are movable for directing the laser beam, and a focusing lens.

In one embodiment, the mirrors are linearly movable.

In another embodiment, the mirrors are rotatable.

DETAILED DESCRIPTION OF THE INVENTION

BRIEF DESCRIPTION OF THE DRAWINGS

The invention will be more clearly understood from the following description of some embodiments thereof, given by way of example only with reference to the accompanying drawing in which:

FIG. A(a) is an example of a known strip of Ball Grid Array devices suitable for use with the invention, in which encapsulant material protects a die and electrical connections between the die and the substrate, the strip including tooling holes and cut-out sections for ease of punching;

FIG. A(b) is similar to the strip of FIG. A(a) but without the cut-out sections;

FIG. A(c) is similar to the strip of FIG. A(b) but without the tooling holes;

FIG. A(d) is similar to the strip of FIG. A(a) but in which encapsulant covers multiple dies;

FIG. B is a known multiple unit, chip-scale package assembly suitable for use with the invention;

FIG. C is a known circuit board panel containing multiple circuit boards suitable for use with the invention;

FIG. D shows the final steps in a known method of manufacturing Ball Grid Array/Chip Scale Package devices.

Figure 1:
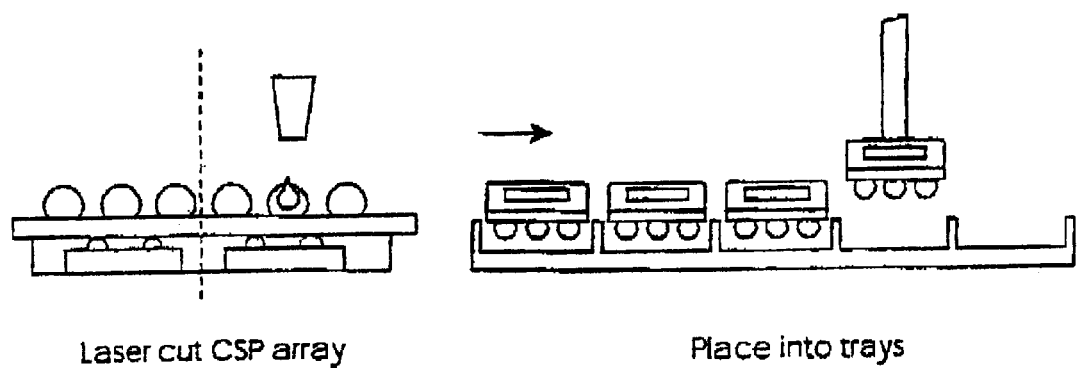
Figure 2:
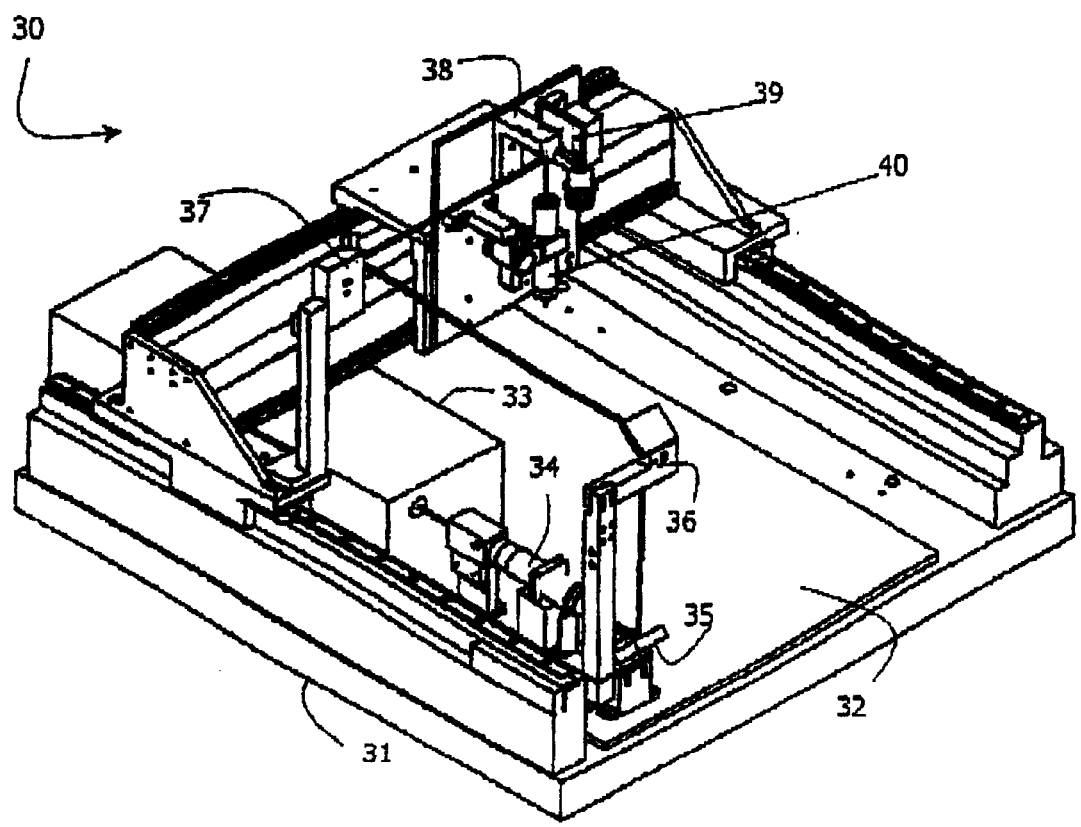
Figure 3:
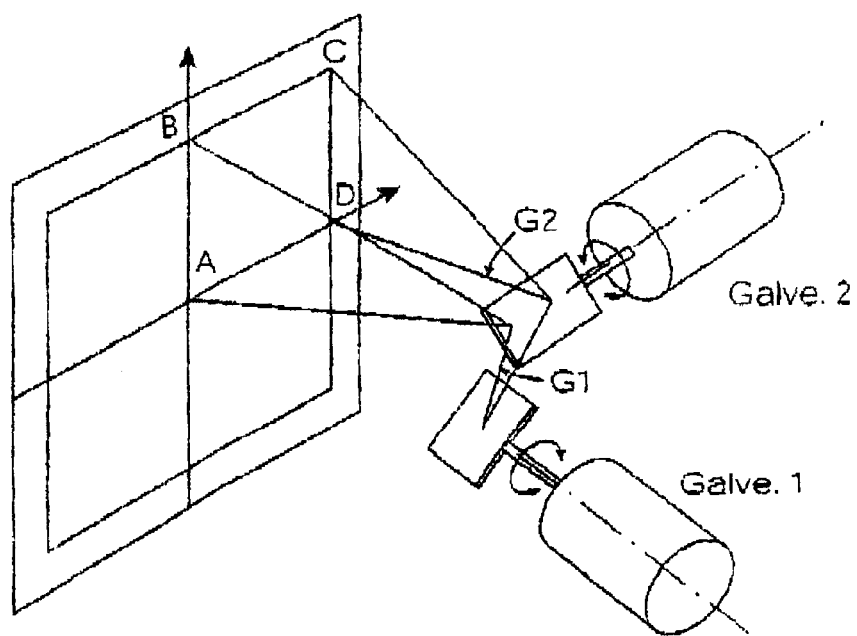
Figure 4:
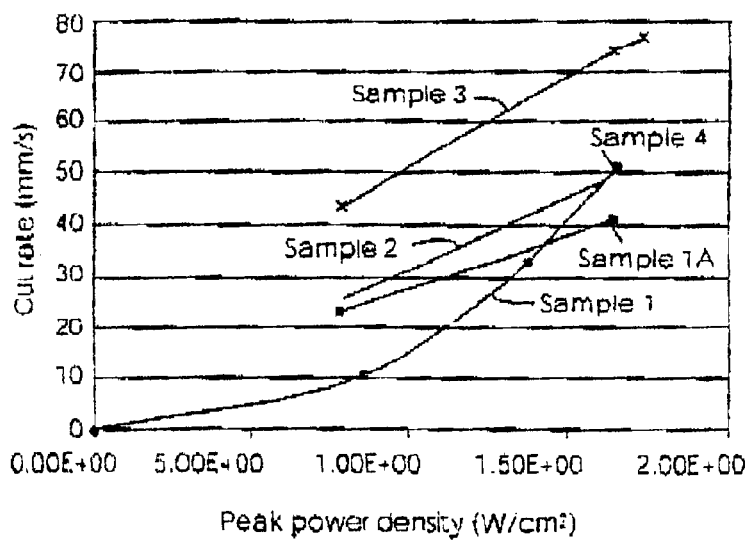
Figure 5:
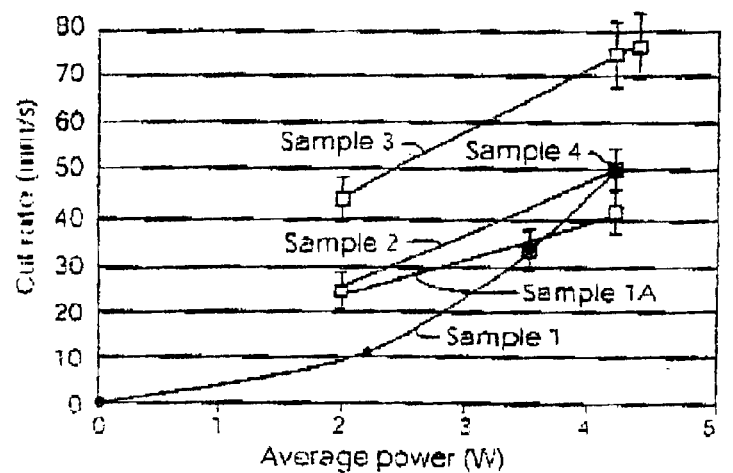

FIG. 1 is a diagrammatic view of a cutting method of the invention;

FIGS. 2 and 3 are diagrams showing control of a laser beam for cutting;

FIGS. 4 and 5 are plots indicting cutting performance; and

FIGS. 6 to 9 inclusive are photographs of cut material cross-sections.

DESCRIPTION OF THE EMBODIMENTS

The invention is based upon use of a laser beam for singulation, as shown in FIG. 1. The process uses an ultraviolet laser to "saw" the package. The laser creates excellent quality cuts which generate only vapor debris, use no consumables, and do not cause any chips or micro-cracks in the cut edges.

The concept of photo-ablative decomposition of materials using ultraviolet laser pulses was introduced by Srinivasin in 1982. (R. Srinavasan et al. Applied physics letters, 41, page 576, 1982). The basic mechanism for material removal differs from longer wavelength processes in that the energy of individual photons at ultra-violet wavelengths is close to the energy of the bonds that hold the material together. Examples of the covalent bond strengths of some representative bonds are shown in Table 1. In addition, at room temperature, the width of the absorption bands is sufficient that, at least for organic covalent bonds, pulsed ultraviolet radiation in the wavelength range below 400 nm (>3eV) is sufficient to cause photo-ablative decomposition.

TABLE 1

Covalent bond strength in polyatomic organic compounds (Source: handbook of chemistry and physics page F239, Ed. 1978–1979, CRC press). The corresponding wavelength of a photon with this energy is also shown.

| Bondtype | eV | λ |
|---|---|---|
| $H_3C$–$CH_3$ | 3.83 | 324 |
| H—$CH_3$ | 4.53 | 274 |
| $CH_3CO$—$COCH_3$ | 2.93 | 423 |
| $C_6H_5CH_2$—$N(CH_3)_2$ | 2.66 | 466 |
| F—$CH_3$ | 4.70 | 264 |

From our investigations into photo-ablative decomposition the following conclusions may be drawn:

Below a certain threshold of fluence or intensity, no ablation is observed. However, photo-degradation can occur and lead to morphological changes on the material surface. (P. E. Dyer et al, Journal of applied physics, 57, p1420, 1985; J. H. Brannon et al., Journal of applied physics, 58, p2036, 1985; R. Srinivasan et al., Applied physics 61 p372, 1987)

The fragments coming off the surface that is being ablated consist of small clusters of material and gaseous products. (R. C. Estler et al, Applied physics letters, 49, p1175, 1986; G. Koren et al, Applied physics letters, 44. p1112, 1984; G. S. Hansen et al., Journal of applied physics, p1878, 1990.)

With the exception of 308 nm ablation of polyimide (D. L. Singleton et al., Chemical physics, 144, p415, 1990), the laser pulse duration and shape are reported to have a determinant effect on the ablation. (R. Srinivasan et al, Applied physics letters, 53, 1233, 1988.)

The photo-ablation process generally occurs on a fast time-scale less than the laser pulse width of 20 ns.

A blast wave is generated following pulse impact and absorption. (R. Srinivasan et al, Journal of applied physics, 68, p1842, 1990).

Absorption coefficient is defined at low power density (mW/cm2) and etch rate represents material removal at much higher power densities (mW to MW/cm2). As ablation starts with absorption, there is often a link between absorption co-efficient, alpha, and the etch depth. That is, a strong absorber will have a lower ablation threshold (power density) than a weak absorber. However, etch rate for a strong absorber can be much smaller as most of the photonic energy is confined to shallower depths. This is a common observation. However, this is by no means the general case. Absorption is only a necessary condition. It is not sufficient. A high absorber could relax radiativley or thermally to its original ground state. To have photo-ablation requires bond breaking, i.e. a reaction from reactant to products via excited state (photo-chemical reaction) or ground state (photo-thermal reaction). Secondly, because of the different intensity regime between the spectroscopic measurement of alpha and the ablation regime, non-linear phenomena such as multi-photon absorption could lead to a dramatic increase (and then possibly to saturation) of the etch rate with power density. In this way, two materials having a similar alpha (i.e. at low intensity) but completely different etch rates (at high intensity) because, in one material, two-photon or multi-photon absorption sets in. For example, at 355 nm the aromatic rings of organic are not yet excited (absorption peaks at 240–280 nm). But with sufficient power-photon bond breaking may occur.

A true description of the processes is difficult because (i) most of the cross sections and relaxation times are unknown, and (ii) ablation happens in the solid state where multi-molecular events, (i.e. the way the energy of the broken bonds dissipates into the matrix), mechanical properties, and thermal properties are also of importance.

The apparatus of the invention uses an ultra-violet solid state laser to cut materials that form chip scale packages such as ball grid arrays, circuit board materials and other "thin film" type materials that may form the lamellae of such laminated packages.

Solid state YAG/YLF and NVO4 lasers and other lasers operating with fundamental laser emission in the visible or infra red may be converted to ultraviolet lasers through second and third harmonic generation, sum and difference frequency mixing in second order nonlinear crystals.

As an example, using lasers operating in the "third harmonic" regime we have established that with average power in excess of 3W, we can meet or better the cut rate required to match most BGA process line throughputs.

The apparatus consists of an ultraviolet laser system as described above, and a beam positioning mechanism. The bean positioning mechanism may be a multiple axis stage as illustrated in FIG. 2 or a scanning galvanometer as illustrated in FIG. 3.

Referring to FIG. 2 a beam positioning mechanism 30 is illustrated. A frame 31 supports a target 32 to be singulated.

The optical path is:
- 33: laser beam source,
- 34: beam optics (expander),
- 35: fixed mirror,
- 36: fixed mirror,
- 37: mirror movable in X direction,
- 38: mirror movable in Y direction,
- 39: camera for alignment to package features, and
- 40: a focusing lens.

The advantages of the translational stage approach are;

Small spot sizes are possible over a large area

Variation in spot size may be effectively eliminated by mirror control.

Highly repeatable and accurate positioning

The cut process may be monitored in real time by observing the light energy reflected from the surface of the material being cut back-reflected along the path of the incident beam and on to a photo-electric detector. In the event that the material has been completely cut, there will be no reflective surface and the signal at the detector will drop to a background level, ideally zero. The reflected light may be U.V. laser light, in which case a beam splitter for the laser wavelength is used. In another embodiment a mirror transparent to Ultraviolet (e.g. 355 nm) is used to reflect a second wavelength such as the second harmonic wavelength (e.g. 532 nm). In this instance, there is no input power sacrifice at the ultraviolet wavelength.

Another possibility is that the feedback mechanism is the visible to infrared emission of the plume generated during the cutting process. In the absence of this plume, no cutting occurs and the sample has been cut through. The presence of the plume may be taken as evidence that cutting is occurring. Furthermore, the spectral content of the plume provides information on the material that is being cut.

Real time control of cutting multi-layer materials is possible by monitoring the spectral output at each position of the pulse on the cut scan. From the control point, once the signal can be delivered and processed before the next measurement occurs it is possible to control the laser output parameters on a pulse to pulse basis. This is beneficial in the case where composite materials such as laminated packages may have variation in material distribution across the cut surface. In addition, once a layer has been completely cut through the laser parameters can be vaned on the fly such that the cut process is optimised for the next layer.

A second option for beam delivery and position control is to use a scanning galvanometer. FIG. 3 shows the essential geometry. Two minors are mounted on current driven galvanometer coils that rotate the axes on which the mirror is mounted. Scanning from position A to position D can be achieved by scanning galvanometer Galv.1 through an angle G1 with galvanometer Galv.2 oriented so that its mirror reflects along this line. Scanning from position A to position B may be achieved by rotating galvanometer Galv.2 through an angle G2 with galvanometer Galv.1 fixed for position A on the AD line. Accordingly, any position in two dimensions may be marked out by a combination of moves of the two mirrors. The galvanometer approach allows high acceleration and deceleration times, resulting in minimal time between moves and minimal effect on processing time.

To deliver a focussed laser beam to the work surface it is necessary to use a flat field lens or a z-axis focus adjustment.

Both galvanometer and gantry systems are possible for ultraviolet laser excising of circuit board and chip scale package materials. The choice depends on the exact requirements of the cutting process.

In a situation where the high acceleration of a galvanometer approach is required with high accuracy a combination of a galvanometer and XY stage or gantry approach can provide this. For example, a specimen may be mounted on an XY stage below a galvanometer arrangement. High speed and acceleration is possible over a small area with a high degree of accuracy through the galvo action and slower moves with high accuracy are possible with the XY stage. Where the number of slower moves is low, the overall effect on processing time will be negligible. This galvo/XY stage combination allows accuracy and speed to be exploited.

The type of laser, the laser output specifications, the beam delivery method and the material that is to be cut all affect the rate at which the material is cut and the quality of the resulting cut.

The optical configuration described above delivers a laser beam to the surface to be cut. Using a lens, the beam is focussed to a small diameter, high-intensity spot. The laser fires pulses in sequence at rates greater than 1 kHz. Cutting is achieved by scanning the beam over the sample (or scanning the sample through the beam) at a speed such that there is sufficient overlap between the pulses to allow cutting. We have established that in order to maximise the cut speed and quality it is necessary to ensure the correct overlap factor and to use multiple passes over the same path to cut through a material. From our investigation into the cutting process we have established that;

- The laser, material and scanning parameters form a set of parameters that must be optimised for the optimum cut speed and quality.
- Using the average power, repetition rate, and scan rate relationships it is possible to ensure a linear scaling of cut rate with average power by using multiple passes.
- The cut quality is also affected by the overlap.
- The focal spot size may be reduced or increased and the corresponding overlap parameter adjusted (by adjusting rep rate or scan rate) if higher peak power density is required.
- The high power density (>100MW/cm2) scaling laws for etch rate or cut rate are different to those observed for low power (1KW to 100MWY/cm2)

Parameter Space (a) Laser Parameters

Wavelength of the laser beam.

Pulse energy: The pulse is the energy within a single pulse of the pulse train, and the energy density is the value per $cm^2$.

Repetition frequency defines the number of pulses per second.

Scan speed: The scan speed of the laser relative to he sample is defined by the required spatial overlap for a given spot size at a fixed repetition rate.

Overlap: The overlap is defined as the percentage of the beam diameter that overlaps spatially with the other pluses in sequence.

Spot size: The spot size or bean diameter determines the peak power density(W/cm2) and fluence (J/cm2) at the cutting surface. Also, the spot size determines at which velocity the laser should be scanned relative to the sample to achieve the required overlap.

$$\text{Overlap (\%)} = \frac{\text{Beam diameter} - \left\{\frac{\text{scan velocity}}{\text{repetition frequency}}\right\}}{\text{Diameter}} \times 100$$

Average power is the pulse energy delivered by all pulses in one second. Energy ×Repetition frequency.

$$\text{Peak Power} = \frac{\text{Energy}}{\text{pulsewidth}}$$

Pulse width: Pulse width determines the peak power and the peak power density $$\text{Peak Power Density} = \frac{\text{Peak power}}{\text{Area}}$$

Peak power density is the peak power delivered per unit area ($cm^2$).

(b) Material Parameters

Absorption Coefficient

The linear absorption coefficient, $\alpha$, determines the penetration depth of the pulse. The Beer Lambert law states that $$I = I_0 e^{-\alpha L}$$

Accordingly, the depth at which the incident intensity, $I_0$, reduces by 50% ($I = I_0/2$) is given by $$L_{\frac{1}{2}} = \frac{Ln2}{\alpha}$$

Two-photon absorption way be understood by taking the total absorption as the sum of a linear and intensity dependent absorption coefficient given by $$\alpha(I) = \alpha_0 + \alpha_2 I \qquad A$$

where $\alpha_0$ is the linear absorption coefficient in $m^{-1}$, $\alpha_2$ is the two-photon absorption coefficient in m/W and I is the intensity in $W/m^2$ For a fixed intensity wave and at a wavelength where two-photon absorption occurs the resulting decrease in the wave intensity may be represented mathematically by $$\frac{dI(z)}{dz} = -\alpha_0 I(z) - \alpha_2 I^2(z) \qquad B$$

where z is the distance that the wave has propagated in meters. Integration of this expression yields the intensity of the wave as a function of the distance propagated;

$$I(z) = \frac{I_0 e^{-\alpha_0 z}}{\frac{1}{\alpha_0}[\alpha_0 + \alpha_2 I_0 (1 - e^{-\alpha_0 z})]} \qquad C$$

where $I_0$ is the initial intensity of the wave. If there is negligible two-photon absorption, $\alpha_2$, is zero and this expression reduces to the Beer-Lambert law for linear absorption. In the presence of two-photon absorption an intensity limiting effect occurs.

Considering these expressions the following conclusions may be drawn.

Energy may be absorbed even if the low intensity absorption coefficient is zero. (A)

As the intensity is increased the total energy absorbed increases (A)

As Intensity is increased in the presence of two photon absorption, the depth at which the intensity is above a threshold value, $I_{th}$, increases also.

Multi-photon Absorption

Similar to two photon absorption three and multi-photon absorption can be defined using the procedures above.

Nonlinear Absorption

Other nonlinear absorption processes include absorption saturation, inverse saturable absorption, and photo-ionisation.

Using an assist gas it is possible to ensure that debris is not redeposited on the sample surface. Also, some gases may enhance photo-removal of material and others may suppress unwanted non-clean chemical processes.

Cut Rate Scaling Parameters

Based on the parameter space described it is possible to state the following.

The wavelength should be less than 400 nm.

The minimum energy density should be $100J/cm^2$ or the minimum peak power density should be $1.0GW/cm^2$.

For a given laser pulse energy, the scan rate and repetition rate define overlap. By increasing scan rate and repetition rate the overlap can be maintained, the number of scans remains constant but the time required to cut decreases linearly according to the increase in scan rate, i.e. the cut rate decreases linearly.

For a given pulse repetition frequency, scan speed and overlap (5%–95°), the number of passes required to cut through a sample decreases as the energy of the pulse is increased. For UV solid stare lasers with average power up to 4 W working at the optimum cut rate and with parameters set to achieve this, the increase generally follows a linear trend. As well as standard photo-ablation, nonlinear absorption and ionization effects occur in the higher power density regime (greater an $100MW/cm^2$).

Accordingly, the cut rate increases with a linear or better than linear dependence on pulse energy. For the UV lasers described above, it is possible to reduce the number of scars required to achieve cutting by:

optimising the cut rate at a low power of 3 W, and by scaling the average power output upward such that the only parameter to change is the pulse energy (for example yielding 15 W average power).

Depending on the material it may be possible to reduce the number of scans by five (15 W/3 W, linear), more the five (super-linear) or less than five (saturating) to achieve complete cutting. Generally, for the materials in chip scale packages, circuit boards and flex circuits, the cut rate increases linearly or "super" linearly as pulse energy is increased.

As example of the scaling laws above consider a 1 mm thick multi-layer structure. We achieve a cut rate of 4.2 mm/s with an average power of 3 W. This is achieved with a repetition rate of 5.5 kHz, pulse-width of 95 ns, scanning at 100 mm/s and with a 25 micron spot size. This requires a total of 24 passes to cut through and achieve the quality required. For this example the corresponding energy density (or fluence) and peak power density may be calculated as:

$$\text{Average Power Density} = \frac{\text{Energy}}{\text{Area}} = \frac{\text{Average Power}}{\text{repetition rate} \times \text{Area}} = 111 \text{ J/cm}^2$$

Peak Power Density =

$$\frac{\text{Peak power}}{\text{Area}} = \frac{\text{Average Power}}{\text{repetition rate} \times \text{pulse width} \times \text{Area}} = 1.2 \text{ GW/cm}^2$$

Increasing the scan rate to 300 mm/s and increasing the repetition rate to 16.5 kHz, and taking the same pulse energy, it is possible to achieve a cut rate of at least 12.6 mm/s. This requires an average power of 9 W. This is within the capability of diode pumped UV solid state lasers.

Increasing the power further at this repetition rate (for example to 18 W) and maintaining all other parameters can then result in a doubling of this rate to 25.2 mm/s.

Keeping all of the above parameters the same, further improvements (cut rate increases) are possible by reducing the pulse-width. Reducing pulse-width for a fixed energy results in an increase in peak power. Nonlinear processes are strongly dependent on peak power and where there is a nonlinear absorption, ionization, or refraction process contributing to the rate of material removal, reducing the pulse-width will increase the material removal rate resulting in an increased cut rate. Ablation also show a strong pulse width dependence.

A further parameter that affects the beam energy/power density at the sample is the beam diameter. Focussing to a smaller beam waist at the sample results in an increase in the peak power density, average power density and energy density at the sample. All of these result in an increase in material removal. Eventually, however the "kerf" or width of the cutting region physically occludes material removal and it is necessary to ensure a sufficient kerf width to maintain the material removal rate. A second factor which much be taken into account is the depth of field. Focussing too tightly will reduce the depth of field. Finally, reproducibility of the positioning system will become critical at smaller beam sizes. With these factors in mind, the optimum beam diameter lies in the range from 8 to 70 microns.

The parameter space is then defined by (in no particular order): Pulsewidth:<100 ns Beam waist:<70 microns Average power:>3 W Repetition frequency:>1 kHz Number of passes:>1

Wavelength:<400 nm

Overlap (rep rate and scan rate dependent): 5% to 95%, and preferably 30% to 50%.

Minimum energy density of 100J/cm² or a minimum peak power density of 1.0GW/cm².

EXAMPLES

Example 1
Flex Circuit Packages and Liquid Crystal Sheet

The laser was a frequency tripled Q-switched Nd: YAG laser. The laser stability was better than 7% about the mean and the mode ration was in the fundamental TEM$_{oo}$. The operating specification is shown in Table 2.

TABLE 2

Laser parameters for Example 1.

| Parameter | Value |
| --- | --- |
| Wavelength | 355 nm |
| Average power | 4 W |
| Pulse-width | 95 ns |
| Rep Rate | 5.5 kHz |
| Pulse energy | 0.727 mJ |
| Fluence | 148 J/cm2 |
| Peak Power | 7.7 KW |
| Peak Power density | 1.56 GW/cm² |

The cutting parameters for five representative flex circuit materials were used. The samples consist of solder mask, poly-imide and adhesive in various laminations.

Sample #1

Contains 5 layers of material. 2-poly-imide, 2-adhesive, 1-solder mask

Sample #1 A

Sample is identical to sample # 1 except for the continuation of the solder mask over the heat bond area on one side.

Sample #2

Sample contains 3 layers of material. 1-poly-imide, 2-solder mask.

Sample #3

Sample contains 5 layers in the non-copper loaded areas. 3-poly-imide, 2-adhesive Sample #4

Sample contains 3 layers of material(1-liquid crystal polymer, 2-solder mask

The optimum rep rate was established by varying the rep rate and scan speed, ensuring similar overlap and counting the number of passes required to machine through. Although the rep rate could be tuned up to 15 kHz the optimum machining performance is obtained when the average power is near the peak. At this point the individual pulse energy may not be at a maximum but the total delivered energy is such that that cutting occurs in the fastest possible time.

The conclusion that may be drawn from the graphs in FIGS. 4 and 5 is:

Above a power density of 0.5 GW/cm2, by varying the pulse energy only, the cut rate increases without saturation. This relationship varies slightly depending on the sample type and thickness but the relationship may be defined as linearly proportional or better.

Example 2
Over Molded Ball Grid Array Package

The effect of overlap.

Using the same laser operating parameters as in Example 1 the cut rate for a 1 mm thick overmolded BGA package was measured as 4.2 mm/sec at 3W average power. This was accomplished by using 24 passes at a sped of 100 mm/s ( approx. 50% overlap at the FWHM intensity point). 20X and 100X SEM images of the edges obtained are shown in FIGS. 6 and 7 respectively. The sample consists of solder mask, glass fiber matrix, epoxy and adhesive, copper and encapsulant regions. It is clear that the edge quality is defect free. The open space that appears is likely due to the free volume of the encapsulant material.

The experiment was repeated with two passes and scanning with a speed of 8.3 mm/sec. This corresponds to a 93% overlap for a 25 micron spot. The 20X and 100X SEM images of the edge are shown in FIGS. 8 and 9 respectively. It is very clear that the cut quality is not as good as in the case for 50% overlap and that this is an important factor in achieving the required cut quality.

The following example indicates the laser beam power requirements. 1 mm thick multilayer overmolded BGA package (see Example 2).

Average power used=3 W
Repetition frequency 5.5 kHz
Spot size 25 microns ($1/e^2$)
Scan speed 100 mm/s
Number of passes required to cut through=24
Effective cut rate=4.2 mm/second Energy density =

$$\frac{\text{Average power}}{\text{repetition frequency} * \text{area}} = \frac{3}{5500 * \pi * (12.5 \times 10^{-4})^2} = 111 \text{ J/cm}^2$$

$$\text{Energy density} = \frac{\text{Average power}}{\text{repetition frequency} * \text{area}} =$$

$$\frac{3}{5500 * \pi * (12.5 \times 10^{-4})^2} = 111 \text{ J/cm}^2$$

Depth of Focus $$\omega(z) = \omega_0 \left[ 1 + \left( \frac{\lambda z}{\pi \omega_0^2} \right)^2 \right]^{\frac{1}{2}}$$

Where $\omega(z)$ is beam waist at a distance z from the minimum beam waist at $\omega_0$ and $\lambda$ is the wavelength. Allowing 5% spot size variation, i.e. $\omega(z)=1.05\ \omega_0$.

With $\omega_0=25$ microns and at a wavelength of 355 nm and solve for $z=\Delta z$ $$\Delta z = \pm \frac{0.32\pi(25 \times 10^{-6})^2}{355 \times 10^{-9}}$$

$$\Delta z = \pm 1.7 \text{ mm}$$

Form this data we can conclude that the energy density, peak power density and average power density regime is unique and also that the depth of focus over which this regime can exist yields a completely new set of parameters for laser machining using ultraviolet light.

Using a laser of this type with an average power greater than 3 W yields a completely new regime of power densities which may be applied to the efficient machining of multiple layer and composite materials such as those used in electronic manufacturing.

It will be appreciated from the above that the invention achieves the following advantages over the prior art.

1. Speed Improvement

Parts transferred directly from previous process in panel, strip, or boats

For example, for singulation of a package having a thickness of 1 mm, a speed of greater than 1000UPH (units per hour) is achieved with a 5 W laser. This may be greater with more power.

No cleaning is required

2. Cost Reduction Over Existing Saws

Unlike use of a diamond saw, the laser cutting process does not incur costs associated with wafer saw, for UV tape deionized water, drying, and for saw consumables 3. Space Laser excising consumes less space in class 1000 clean room area. Laser excising and inspection require only approximately 2 square metre, as opposed to approximately 5 square metres for prior art sawing, handling, and inspection equipment.

4. Cut Quality

The excising method of the invention results in much smaller "kerf". Typically in the prior art methods saws are given 250 μm waste area and use 175 μm cuts. In the invention, the waste area is 25 μm or less. Thus, the invention achieves great "real estate" for components, particularly small components. Also, the invention achieves edges with less stress and no micro-cracking.

The invention is not limited to the embodiments described but may be varied in construction and detail within the scope of the claims.

What is claimed is:

1. A method for singulating an electronic circuit by cutting laminated material joining the circuits, the method comprising the steps of:
   generating a laser beam having the following properties:
     a wavelength of less than 400 nm, and
     a minimum energy density of 100 J/cm$^2$ or a minimum peak power density of 1 GW/cm$^2$;
   aligning the beam relative to a feature or fiducial of the material; and
   training the beam along the material until a cut has been made.

2. A method as claimed in claim 1, wherein the beam is moved to have a spatial overlap of consecutive pulses, the overlap being in the range of 5% to 95%.

3. A method as claimed in claim 2, wherein the overlap is in the range of 30% to 50%.

4. A method as claimed in claim 1, wherein the beam is moved in a plurality of passes.

5. A method as claimed in claim 4, wherein the beam is moved in greater than five passes.

6. A method as claimed in claim 1, wherein the beam is generated with a pulse repetition rate of greater than 1 kHz.

7. A method as claimed in claim 1, wherein the thickness of the laminated structures may be up to the thickness defined by the depth of focus of the laser beam.

8. A method as claimed in claim 1, wherein the laminate material contains two or more layers selected from BT epoxy, glass fibers, copper, gold, poly-imide, adhesive, overmold materials, underfills, conductors, dielectrics, stiffeners, stabilisers, protectors or other materials as used in electronic packaging.

9. A method as claimed in a claim 1, wherein the individual layers of the laminate material have different ablation and ionization thresholds, different abalation and ionization rates, and different non-linear absorption and non-ionization coefficients.

10. A method as claimed in claim 1, wherein the beam is generated from a solid state laser with a characteristics average power peak at a specific repetition frequency.

11. A method as claimed in claim 1, wherein the beam is controlled so that the average power drops as the repetition frequency is increased or decreased, and although individual pulse energy may be increased at a repetition frequency other than the repetition frequency for maximum average power the maximum cut rate is achieved at a repetition frequency other than either of these frequencies due to the contribution of other laser cutting parameters.

12. A method as claimed in claim 1, wherein the average power of said laser beam is greater than 3W, with a pulse width less than 100 nanoseconds, a consecutive pulse spatial overlap of 10–70%, and a beam diameter less than 70 microns at the $1/e^2$ point of a spatial intensity profile.

13. A method as claimed in claim 1, wherein the laser beam is generated by a diode laser pumped gain medium device with a fundamental emission in the 900 to 1600 nm wavelength range and with second, third, fourth or fifth harmonic generation of ½, ⅓, ¼, $⅕^{th}$ of this wavelength which is obtained by placing appropriate crystals in the laser cavity or outside the laser cavity.

14. A method as claimed in claim 13, wherein said laser device may be of the Nd:YAG, ND:YLF, Nd:YVO4 or the other combinations of Impurity:Host gain media lasting in the required range and with harmonic generation to an operating wavelength of less than 400 nm.

15. A method as claimed in claim 1, wherein the beam is delivered to the work surface using one or more mirrors mounted on one or more scanning galvanometers, and in which the required spot site is achieved by use of an on-axis lens position adjustment at a stage before the galvanometer mirror, and at a stage after the galvanometer mirror by a lens of a flat field lens, or by the use of a combination of these lenses.

16. A method as claimed in claim 1, wherein the laser beam is delivered using one or more mirrors mounted on one or more translational stages, and focusing is achieved by the use of a telescope or an on-axis lens before moving mirrors or lens mounted before the sample surface and moving with the beam delivery mirror such that the focussed beam is delivered to the sample surface.

17. A method as claimed in claim 1, wherein the beam is telescoped and focussed to achieve the required spot size at the cutting plane with the telescope or scan lens chosen such that the beam waist remains within a specified percentage of the optimum spot site throughout the range over which the beam is delivered, and wherein the range is greater than the thickness of the part.

18. A method as claimed in claim 1, wherein an assist gas is used to assist the cutting process to prevent debris from being deposited on the material surface, and wherein the assist gas removes material generated during the cut process so that it does not create absorption or scattering of consecutive laser light pulses.

19. A method as claimed in claim 18, wherein the assist gas is used to provide an inert atmosphere to prevent unwanted specific photochemical or photo-physical reactions form occurring during cutting.

20. A method as claimed in claim 1, wherein a vacuum suction process is used to extract fumes and solid debris generated at the cut surface.

21. A method as claimed in claim 1, wherein alignment of the laser beam to a feature on the material surface is achieved by use of a sensor and means for image processing to provide the coordinates along which cutting occurs, and wherein a beam positioning mechanism is controlled to ensue that the laser beam follows the required cutting path.

22. A circuit singulation system comprising:
means for supporting a set of electronic circuits interconnected by material;
a laser beam source comprising means for generating a laser beam having:
a wavelength of less than 400 nm, and
a minimum energy density of 100 $J/cm^2$ or a peak power density of 1 $GW/cm^2$,
a beam positioning mechanism comprising means for directing the beam a the material and for training it along cut lines to singulate the electronic circuits.

23. A circuit singulation system as claimed in claim 22, wherein the beam positioning system comprises a series of minors at least some of which are movable for directing the laser beam, and a focusing lens.

24. A circuit singulation system as claimed in claim 23, wherein the mirrors are linearly movable.

25. A circuit singulation system as claimed in claim 24, wherein the mirrors are rotatable.

* * * * *